United States Patent
Graetz

(10) Patent No.: US 8,518,798 B2
(45) Date of Patent: Aug. 27, 2013

(54) SEMICONDUCTOR STRUCTURE AND METHOD FOR MAKING SAME

(75) Inventor: Eric Graetz, Krumpendorf (AT)

(73) Assignee: Infineon Technologies AG, Neubiberg (DE)

( * ) Notice: Subject to any disclaimer, the term of this patent is extended or adjusted under 35 U.S.C. 154(b) by 119 days.

(21) Appl. No.: 12/888,454

(22) Filed: Sep. 23, 2010

(65) Prior Publication Data

US 2012/0074517 A1    Mar. 29, 2012

(51) Int. Cl.
*H01L 21/30* (2006.01)

(52) U.S. Cl.
USPC ..................... 438/458; 257/E21.32

(58) Field of Classification Search
USPC ............. 438/458, 149; 257/E21.32, E21.561
See application file for complete search history.

(56) References Cited

U.S. PATENT DOCUMENTS

| | | | |
|---|---|---|---|
| 8,288,248 B2 * | 10/2012 | Yamazaki | 438/458 |
| 2003/0024635 A1 | 2/2003 | Utsunomiya | |
| 2006/0214230 A1 | 9/2006 | Shimokawa | |
| 2007/0262403 A1 | 11/2007 | Tsurume | |
| 2008/0213953 A1 | 9/2008 | Yamazaki | |
| 2009/0156016 A1 | 6/2009 | Di Cioccia | |
| 2010/0283056 A1 * | 11/2010 | Yasumatsu | 257/59 |

FOREIGN PATENT DOCUMENTS

| | | | |
|---|---|---|---|
| JP | 2001223434 A | 8/2001 | |
| JP | 2007266044 A | 10/2007 | |

* cited by examiner

*Primary Examiner* — Quoc Hoang
(74) *Attorney, Agent, or Firm* — Infineon Techn. AG; Philip H. Schlazer

(57) ABSTRACT

One or more embodiments relate to a method for forming a semiconductor structure, including: forming a semiconductor layer; and forming a dielectric layer over a back side of said semiconductor layer. In one or more embodiments, the dielectric layer may be a silicone rubber layer.

35 Claims, 13 Drawing Sheets

SEMICONDUCTOR STRUCTURE AND METHOD FOR MAKING SAME

TECHNICAL FIELD

One or more embodiments of the present invention relate to semiconductor structures and methods for making semiconductor structures.

BACKGROUND

To achieve faster switching lateral power semiconductor devices it may be useful to reduce the amount of mobile charge below the device. New device structures are needed.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1:
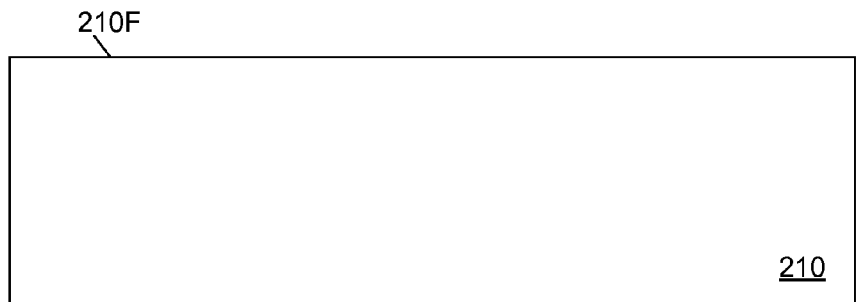
FIGS. 1 through 12 show a process for making a semiconductor structure in accordance with an embodiment of the present invention.

FIG. 1 shows a support structure 210. The support structure 210 includes a front side 210F and a back side 210B. The front side 210F may correspond to the top side of the support structure 210 while the back side 210B may correspond to the bottom side of the support structure 210.

In one or more embodiments, the support structure 210 may be a semiconductor substrate (e.g. a semiconductor wafer). In one or more embodiments, the semiconductor substrate may be a bulk semiconductor substrate (e.g. a bulk semiconductor wafer). In one or more embodiments, the semiconductor substrate may be an SOI semiconductor substrate (e.g. an SOI semiconductor wafer). An SOI semiconductor substrate may include a bulk semiconductor substrate, an SOI dielectric layer, and a semiconductor layer overlying the SOI dielectric layer.

In one or more embodiments, a semiconductor substrate may be a silicon substrate (e.g. a silicon wafer). The silicon substrate may be a bulk silicon substrate (e.g. a bulk silicon wafer) comprising monocrystalline silicon. Hence, in one or more embodiments, the bulk semiconductor substrate may be a bulk silicon substrate (e.g. bulk silicon wafer). The bulk silicon substrate may include or may not include an epitaxial layer.

An example of a bulk silicon substrate (e.g. a bulk silicon wafer) is a Czochralski (CZ) silicon wafer. Another type of a bulk silicon wafer is a Flat-Zone (FZ) silicon wafer. The bulk silicon substrate (e.g. bulk silicon wafer) may comprise (or may consist essentially of) bulk silicon such as bulk monocrystalline silicon. The bulk silicon may be p-doped.

In one or more embodiments, a silicon substrate may be an SOI silicon substrate. The SOI silicon substrate may include a bulk silicon substrate, an SOI dielectric layer and a layer of bulk silicon overlying said SOI dielectric layer. The SOI dielectric layer may be a buried oxide layer.

Other examples of semiconductor substrates include, but not limited to, silicon carbide substrates (e.g. wafers), GaAs substrates (e.g. wafers) and GaN substrates (e.g. wafers). A substrate may be a bulk substrate (e.g. bulk wafer) or a substrate may be an SOI substrate (e.g. SOI wafer). As noted, an SOI semiconductor substrate (e.g. an SOI semiconductor wafer) may include a bulk semiconductor substrate, a dielectric layer overlying the bulk semiconductor substrate and a semiconductor layer overlying the dielectric layer.

It is noted that an additional example of a semiconductor substrate (e.g. an SOI semiconductor substrate) is a SOS (silicon on sapphire) substrate.

Figure 2:

As noted, in one or more embodiments, the support structure 210 may be a bulk semiconductor substrate 210 (However, it is understood that the support structure 210 may be any type of support structure including any type of semiconductor substrate). The substrate 210 has a front side 210F (e.g. top side) and a back side 210B (e.g. bottom side). Referring to FIG. 2, a portion of the substrate 210 may be modified so that the substrate 210 includes an etch stop layer 220. The etch stop layer 220 may be formed anywhere within the substrate 210. In one or more embodiments, the etch stop layer may be formed in an upper portion of the substrate 210. In one or more embodiments, the top surface of the etch stop layer 220 may correspond to the top surface of the substrate 210. In one or more embodiments, the top surface of the etch stop layer 220 may be slightly below the top surface of the etch stop layer 220.

The etch stop layer 220 may be formed by an ion implantation process. In some embodiments, the ion implantation may be ion implantation of donors and/or acceptors. In some embodiments, the etch stop layer 220 may be formed by the ion implantation of germanium.

Referring to FIG. 2, it is seen that, in some embodiments, that the substrate 210 may include an etch stop layer 220 that was formed within the substrate 210 as well as a remaining part 210R that is not the etch stop layer.

Figure 3:

Referring to FIG. 3, a semiconductor layer 230 may be formed over the front side 210F (e.g. top side) of the substrate 210. Hence, the semiconductor layer 230 may also overlie a front side (e.g. top side) of the etch stop layer 220. In one or more embodiments, the semiconductor layer 230 may a silicon layer. In one or more embodiments, the silicon layer may comprise monocrystalline silicon. The semiconductor layer 230 has a front side 230F (e.g. a top side) and a back side 230B (e.g. a bottom side).

In one or more embodiments, the semiconductor layer 230 may be formed as an epitaxial layer. The semiconductor layer 230 (e.g. epitaxial layer) may, for example, be formed by an epitaxial growth process. In one or more embodiments, the epitaxial growth process may be a selective epitaxial growth process. In one or more embodiments, the epitaxial layer may be formed by using a deposition process such as a chemical vapor deposition process. In one or more embodiments, the substrate 210 may be a bulk silicon substrate (e.g. a bulk silicon wafer) and may comprise bulk silicon (such as bulk monocrystalline silicon). In this case, the semiconductor layer 230 (e.g. an epitaxial layer) may also include bulk silicon (for example, bulk monocrystalline silicon). In one or more embodiments, the epitaxial layer may be a bulk monocrystalline silicon layer. The monocrystalline silicon layer may be a doped layer. The dopant may be p-type or n-type.

The semiconductor layer 230 (e.g. the epitaxial layer) may be doped (e.g. p-type or n-type) by an in-situ process or by an introduction process such as ion implantation or diffusion. There may be other ways of introducing the dopant. In one or more embodiments, the dopant type of the semiconductor layer 230 may be the same as the dopant type of the bulk semiconductor substrate 210.

It is noted that the semiconductor layer 230 may include any semiconductor material and is not limited to silicon. The semiconductor layer may include one or more semiconductor materials. The semiconductor layer may include one or more semiconductor compounds. Examples of semiconductor materials include silicon, GaAs, GaN and combinations thereof. In one or more embodiments, the semiconductor layer 230 may be formed of the same semiconductor materials as the semiconductor substrate 210. In one or more embodiments, the semiconductor layer 230 may comprise one or more different semiconductor materials from the semiconductor substrate 210.

In one or more embodiments, the semiconductor layer 230 may be in direct contact with the substrate 210.

In some embodiments, the semiconductor layer 230 may have a thickness of about 20 microns or less. In some embodiments, the semiconductor layer 230 may have a thickness of about 15 microns or less. In some embodiments, the semiconductor layer 230 may have a thickness of about 10 microns or less. In one or more embodiments, the semiconductor layer 230 may have a thickness of about 5 microns or more.

Figure 4A:
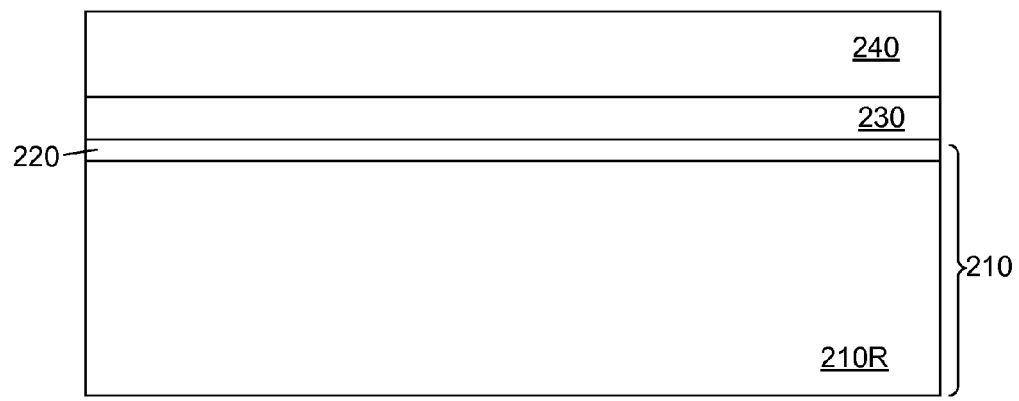

Referring to FIG. 4A, in one or more embodiments, after the formation of the semiconductor layer 230, a layer 240 may, be formed over the front side (e.g. top side) of the semiconductor layer 230. The layer 240 may represent one or more layers of additional processing steps used to form a semiconductor chip and/or integrated circuit. For example, the layer 240 may represent one or more metallization levels and/or one or more inter-level dielectric layers and/or a passivation layer. The layer 240 may represent one or more layers resulting from the processing steps of a CMOS process. Hence, the layer 240 may represent a single homogeneous layer or the layer 240 may represent a plurality of two or more sub-layers.

In one or more embodiments, the layer 240 may be in direct contact with the semiconductor layer 230.

Figure 4B:
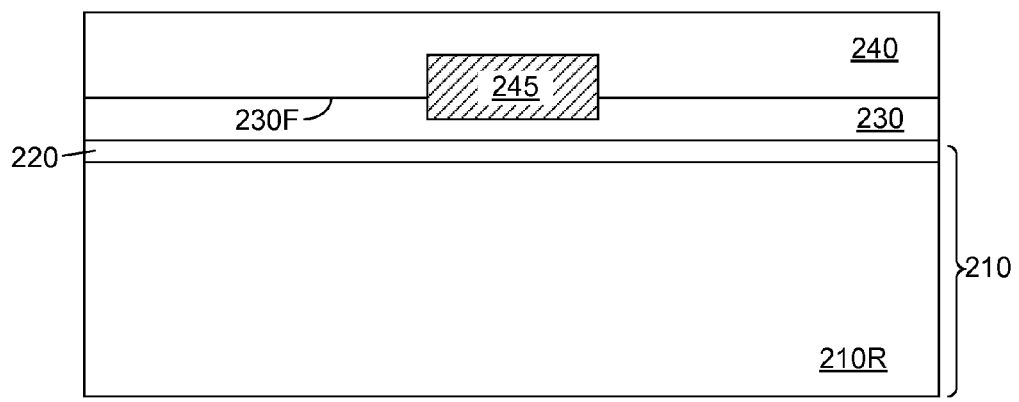

Referring to FIG. 4B, in one or more embodiments, after the formation of the semiconductor layer 230, one or more devices 245 may be formed over the front side of the semiconductor substrate 210. In one or more embodiments, a device may not be in direct contact with the substrate 210. In one or more embodiments, a device may be in direct contact with the substrate 210.

A device 245 may be any type of electronic device and/or semiconductor device. The device 245 may be an active device or a passive device. The device 245 may be formed so that at least a portion of the device may formed within the semiconductor layer 230 and/or at least a portion of the device may be formed over a front side 230F (e.g. top side) of the semiconductor layer 230. Hence, in one or more embodiments, a portion of a device 245 may be formed within the semiconductor layer and a portion of a device may be formed over the front side 230F of semiconductor layer 230. In one or more embodiments, a device may be formed so that essentially all of the device is formed within the semiconductor layer 230. In one or more embodiments, a device may be formed so that essentially all of the device is formed over the front side 230F of the semiconductor layer 230.

FIG. 4B shows an example of a device 245 formed over the front side of the substrate 210. In the example shown a portion of the device 245 is formed within the semiconductor layer 230 and a portion of the device 245 is formed over the semiconductor layer 230. As noted, in other embodiments, a device may be formed such that at least a portion of the device is formed within the semiconductor layer 230 and/or a least a portion of the device is formed over the semiconductor layer 230.

In one or more embodiments, the device 245 may include at least a portion of layer 240. In one or more embodiments, at least a portion of device 245 may be formed as a result of forming at least a portion of layer 240.

In one or more embodiments, the device 245 may, for example, be a transistor. In one or more embodiments, a transistor (e.g. MOS transistor) may be formed such that the source/drain regions are formed within the semiconductor layer 230. The gate of the transistor may be formed over the front side 230F of the semiconductor layer 230. In another embodiment, the device 245 may be a bipolar transistor. In some embodiments, the device 245 may be a lateral device. In some embodiments, a lateral device may be a device where the device current flows substantially perpendicular to the thickness of the semiconductor layer 230. An example of a lateral device is shown in FIG. 14B and is explained below.

Figure 5:
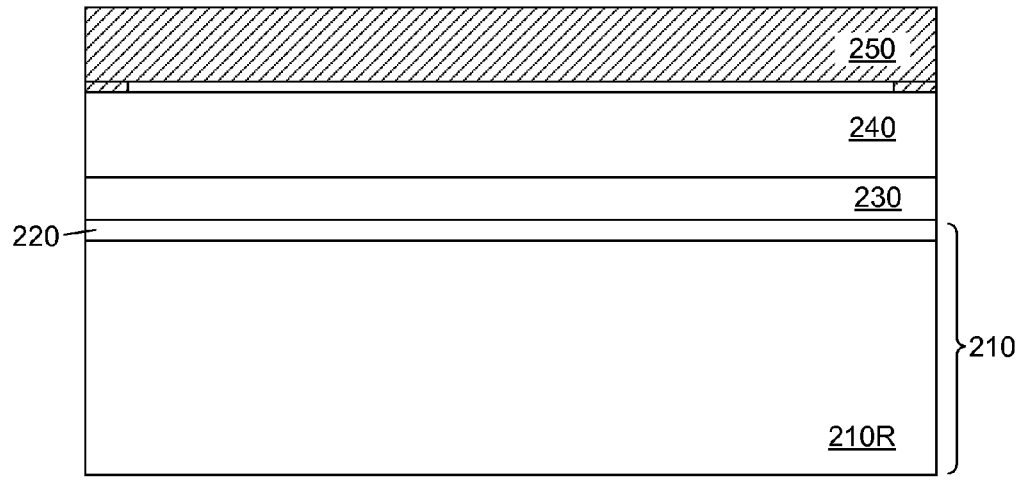

Referring to FIG. 5, a protection structure 250 (e.g. a protection wafer) may be applied so as to cover the top surface of layer 240. The protection structure 250 may be attached in any way, including adhesives, mechanical forces (e.g., suction), and electrostatic forces, magnetic forces, etc. The protection structure 250 may be attached to the layer 240 about the periphery (e.g. a portion that does not include devices). In some embodiments, the layer 240 as well as the protection structure 250 may have a circular perimeter. In this case, the attachment may be at an attachment area which is annular. The protection structure 250 may, for example, be useful to protect devices formed in the structure during removal of the semiconductor substrate 210 (e.g. grinding) as explained below.

Figure 6:
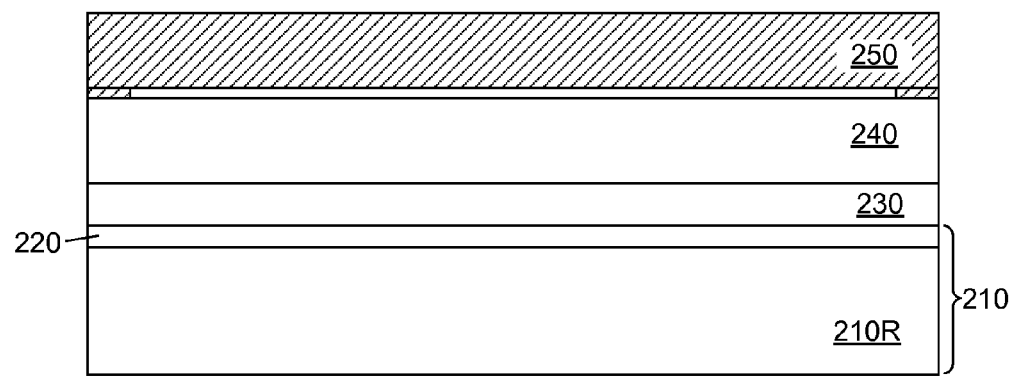

The bulk semiconductor substrate 210 (which may, for example, be a bulk silicon substrate) may then be removed. This may be done in a single step or this may be done using two or more removal steps. Referring to FIG. 6, in some embodiments, the part 210R of the substrate 210 may be removed by one or more removal processes. The removal of part 210R may include a first removal process which may be a back side grinding process of at least a portion of part 210R. In some embodiments, back side grinding may be replaced with some other removal process (mechanical or non-mechanical).

Hence, in an embodiment, the back side grinding process may thin the part 210R without completely removing it. In some embodiments, as a result of the back side grinding process, the thickness of the substrate 210 may be reduced to a thickness of about 40 microns or below. In some embodiments, the thickness of the substrate 210 may be reduced to a thickness of about 30 microns or below.

The result of the back side grinding process is shown in FIG. 6. In one or more embodiments, as shown in FIG. 6, a portion of part 210R may still remain after the back side grinding process.

Figure 7:
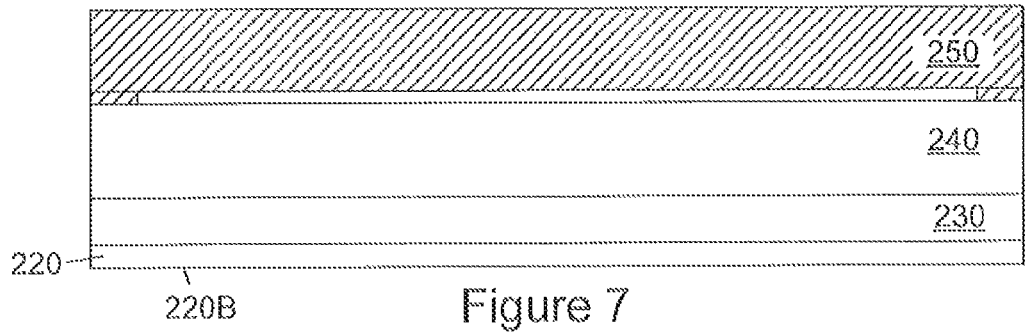

Referring to FIG. 7, another portion of the part 210R of the bulk semiconductor substrate 210 may then be removed using a second removal process. This second removal process may be a back side etching process. The back side etching process may comprise a wet etching process. The wet etching process may use a wet etchant. In one or more embodiments, potassium hydroxide (e.g. KOH) etchant may be used. In one or more embodiments, a tetramethylammonium hydroxide (e.g. TMAH) etchant may be used. In one or more embodiments, the etchant used may remove the semiconductor substrate material of part 210R selective to the etch stop layer 220.

This second removal process (e.g. a wet etching process) may be continued until the etch stop layer 220 is reached or exposed. In some embodiments, the etching of the part 210R may stop essentially on the etch stop layer 220. It is possible that a small amount of the etch stop layer is also etched. Hence, in one or more embodiments, the etching process to remove a portion of part 210R may stop essentially on the etch stop layer 220. The result of the second removal process (e.g. the wet etching process) is shown in FIG. 7. FIG. 7 shows etch stop layer 220 having a back side 220B.

Figure 8:
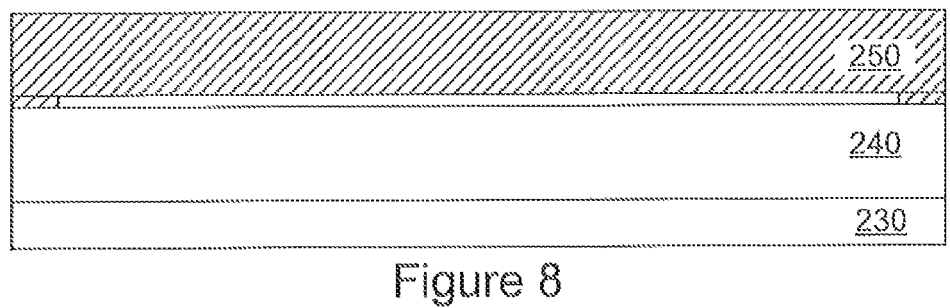

Referring to FIG. 8, the etch stop layer 220 may then be removed. The etch stop layer 220 may be removed by a removal process. In one or more embodiments, the removal of the etch stop layer 220 may be accomplished by a back side etching process of the etch stop layer 220. The back side etching process to remove the etch stop layer 220 may include a wet etching process. The back side etching process to remove the etch stop layer may include an etching chemistry different from the etching chemistry used to perform the wet etch to remove the remaining portion of part 210R of bulk semiconductor substrate 210. In one or more embodiments, the etchant used to remove the etch stop layer 220 may be a phosphoric acid etchant.

It is possible that the etch stop layer 220 may be formed slightly below the front side 210F of the bulk substrate 210. In this case, the etch used to remove the etch stop layer 220 (e.g. phosphoric acid) may also be used to etch (e.g. as an over etch) the small amount of (non-etch stop) substrate 210 that may be overlie the etch stop layer 220 and be between the etch stop layer 220 and the semiconductor layer 230.

The etching of the etch stop layer 220 may be performed as a controlled (e.g. timed) etch so that the etch may stop essentially when the semiconductor layer 230 (e.g. epitaxial layer) is reached. It is understood that, since the etch may be a timed etch, it is possible that a small amount of the semiconductor layer 230 may also be etched in the process of removing the etch stop layer 220. In some embodiments, removal of the etch stop layer 220, may thus complete the removal of the bulk semiconductor substrate 210. It is understood that, in some instances, it may be possible that a trace amount of the substrate 210 (or some other support structure) may remain.

Figure 9:
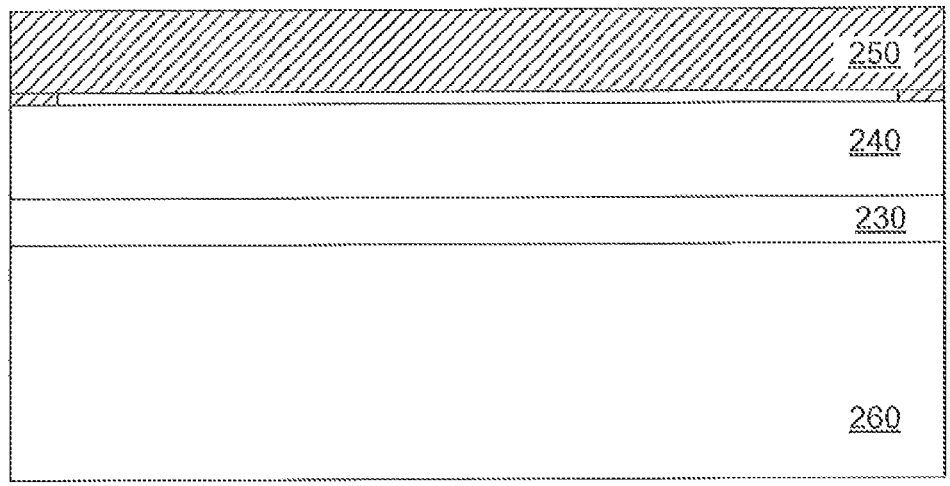

It is noted, in some embodiments, it is possible that an etch stop layer 220 is not formed and that the semiconductor substrate 210 is removed without the use of an etch stop layer. Referring to FIG. 9, a layer 260 may then formed over the back side of the semiconductor layer 230. In one or more embodiments, the layer 260 may be a dielectric layer (for example, an electrically insulating layer). In one or more embodiments, the layer 260 may comprise one or more dielectric materials. Examples of dielectric materials include oxides, nitrides, oxynitrides and combinations thereof. Examples of dielectric materials further include rubbers, plastics, ceramics, glass, and plexaglass. In one or more embodiments, the dielectric material may be stable (e.g. thermally and/or chemically stable) at a temperature of about 250° C. In one or more embodiments, the layer 260 may comprise (or may consist essentially of or may be) a solid material. In one or more embodiments, the layer 260 may support the semiconductor layer 230. In one or more embodiments, the layer 260 may be in direct contact with the semiconductor layer 230.

In one or more embodiments, the layer 260 may comprise (or may consist essentially of) silicone rubber. In one or more embodiments, the layer 260 may be a silicone rubber layer. The silicon rubber layer 260 may be applied by a spin coat process. The silicone rubber may be a polymer material. The polymer may, for example, be a polysiloxanes. The polysiloxanes may include a siloxane backbone consisting of Si—O—Si units.

In one or more embodiments, the layer 260 may have a thickness of about 25 microns or more. In one or more embodiments, the layer 260 may have a thickness of about 50 microns or more. In one or more embodiments, the layer 260 may have a thickness of about 75 microns or more. In one or more embodiments, the layer 260 may have a thickness of about 100 microns or more. In one or more embodiments, the layer 260 may have a thickness of about 150 microns or less. In one or more embodiments, the layer 260 may have a thickness of about 125 microns or less. In one or more embodiments, the layer 260 may have a thickness of about 100 microns.

Figure 10:
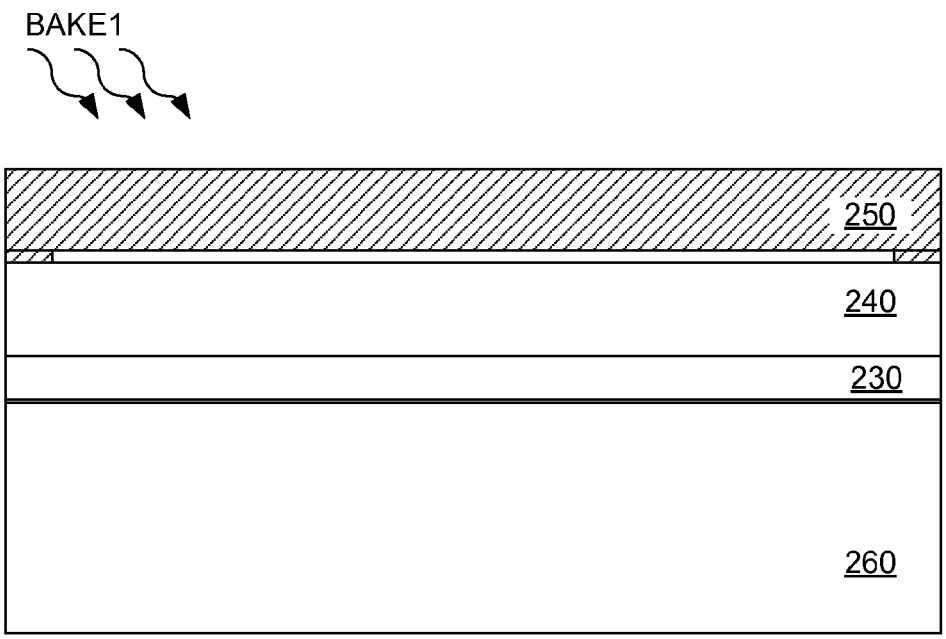

Referring to FIG. 10, a first baking process BAKE1 may be applied to the structure shown in FIG. 9 (which is repeated in FIG. 10). In some embodiments, the first baking process BAKE1 may be performed at a temperature of about 100° C. or greater. In some embodiments, the first baking process may be performed at a temperature of about 110° C. or greater. In some embodiments, the first baking process may be performed at a temperature of about 120° C. or greater. In some embodiments, the first baking process may be performed for a period of time of about 45 seconds or greater. In some embodiments, the first baking process may be performed for a period of time of about 60 seconds or greater. In some embodiments, the first baking process may be performed for a period of time of about 90 seconds or greater. In some embodiments, the first baking process may be performed for a period of time of about 120 seconds or greater. In one or more embodiments, the first bake process BAKE1 may be a soft bake process.

The first bake process BAKE1 may be useful after the application of the silicone rubber layer 260. The first bake process may help to mechanically stabilize the silicone rubber layer and may prevent thickness variations or may help prevent the silicone rubber from dripping.

Figure 11:
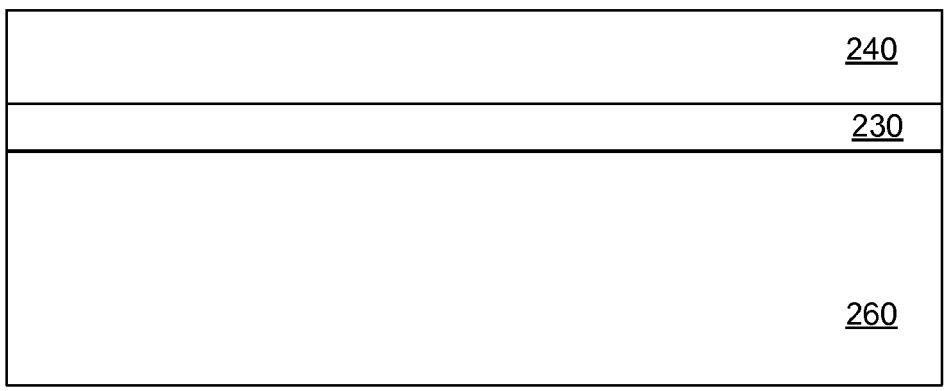

Referring to FIG. 11, the protection structure 250 (e.g. a protection wafer) may be removed from layer 240. In other embodiments, it is possible that the protection structure 250 be removed at some other time after grinding of the back side of the semiconductor substrate 210 as explained above.

Figure 12:
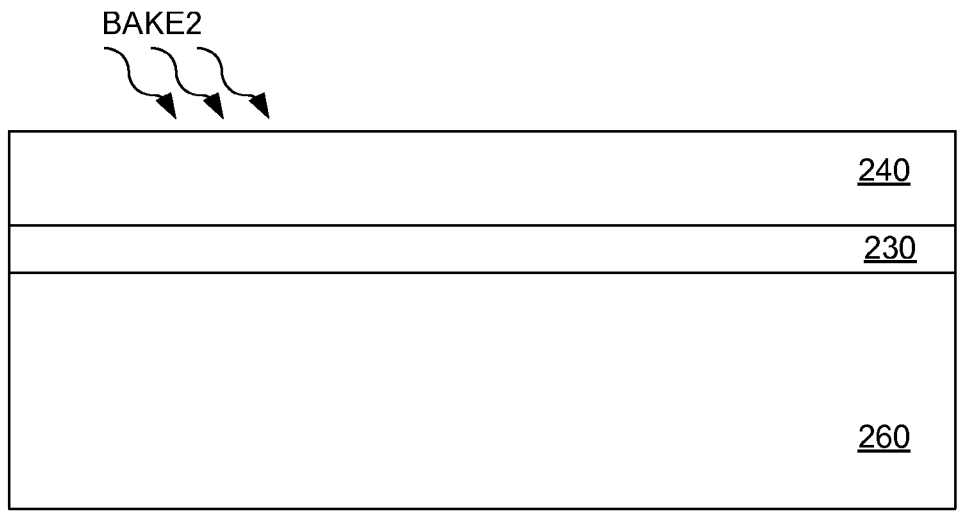

Referring to FIG. 12, a second bake process BAKE2 may be applied to the structure shown in FIG. 11 (and repeated in FIG. 12). In one or more embodiments, the second bake process BAKE2 may be a hard bake process. The second bake process BAKE2 may be performed at a temperature of about 125° C. or greater. The second bake process may be performed at a temperature of about 150° C. or greater. The second bake process may be performed for a period of time of about 90 minutes or greater. The second bake process may be performed for a period of time of about 120 minutes or greater. In some embodiments, the second bake process may be at a higher temperature than the first bake process. In some embodiments, the second bake process may be for a longer period of time than the first bake process. The second bake may help give the silicone rubber desirable mechanical and electrical properties.

Figure 13:
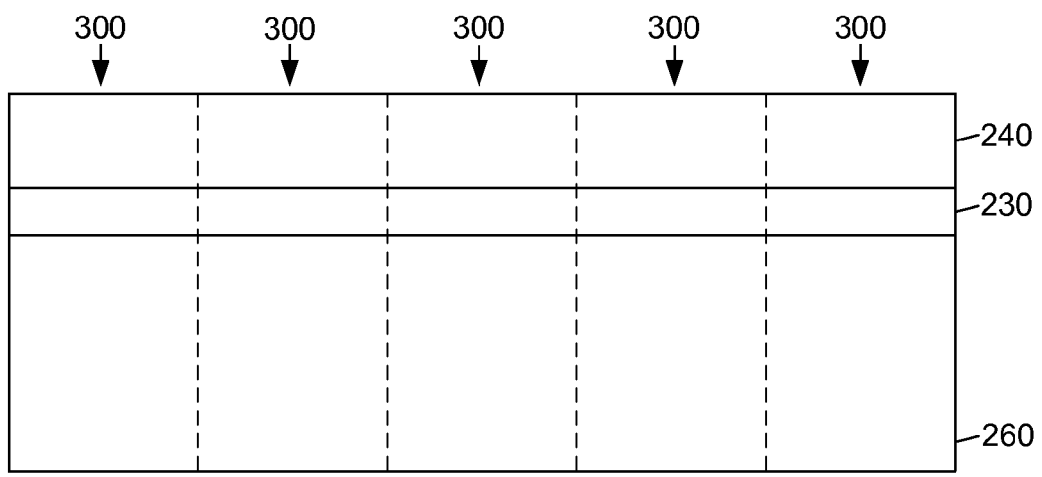
FIG. 13 shows a dicing of the structure shown in FIG. 12.

Referring to FIG. 13, the semiconductor structure shown in FIG. 12 (including the silicone rubber layer 260, the semiconductor layer 230, and the layer 240) may be laminated onto a dicing foil (not shown) and diced to create individual semiconductor structures 300 (e.g. separated or partitioned into individual semiconductor structures 300). Each of the individual semiconductor structures 300 may represent an individual semiconductor chip and/or integrated circuit. For example, each semiconductor chip 300 may include an integrated circuit. Each individual structure 300 (e.g. semiconductor chip) may include one or more electronic devices (e.g. semiconductor devices) that may be coupled together to form an integrated circuit which may, for example, represent a more complex electronic device (e.g. a more complex semiconductor device).

Figure 14A:
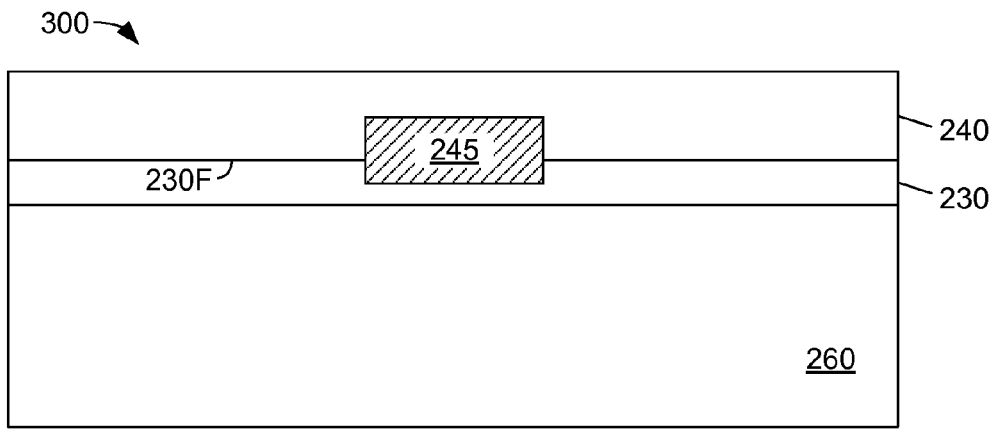
FIG. 14A shows a semiconductor structure including a device in accordance with an embodiment of the present invention.
Figure 14B:
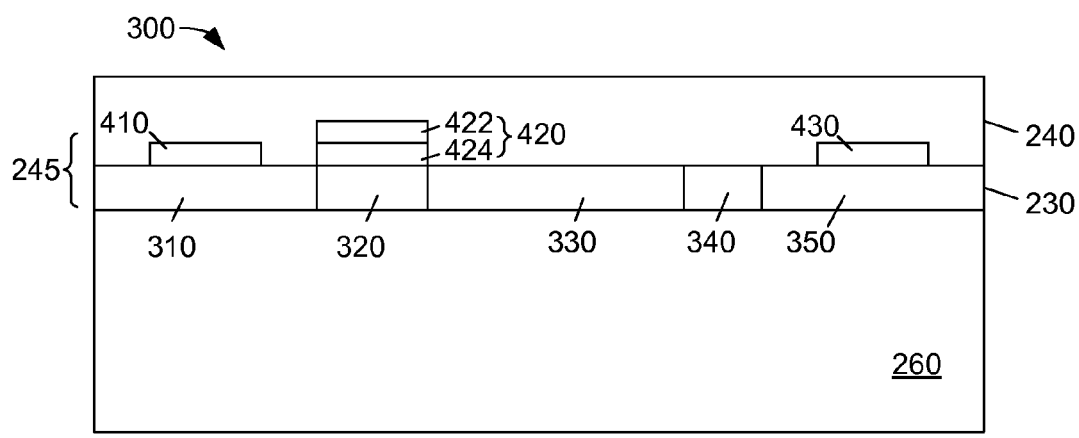
FIG. 14B shows a semiconductor structure including a device in accordance with an embodiment of the present invention.

FIG. 14A provides an example of an individual semiconductor chip 300. The semiconductor chip 300 includes a silicone rubber layer 260, a semiconductor layer 230 (which may be a bulk monocrystalline silicon epitaxial layer) overlying the silicone rubber layer 260 and a layer 240 overlying the semiconductor layer 230. As noted above, the layer 240 may represent one or more metallization layers, one or more inter-level dielectric layers, a passivation layer, etc. The layer 240 may even include a redistribution layer. It is understood that, in one or more embodiments, the silicone rubber layer 260 may be replaced with a different dielectric layer.

The semiconductor chip 300 may include at least one device 245 (e.g. an electronic device and/or semiconductor device). As noted above, the device 245 may be any device, including any passive or active device. In the embodiment shown in FIG. 14A, a portion of the device 245 may be formed within the semiconductor layer 230 and a portion of the device 245 may be formed over the front side 230F of layer 230. In one or more embodiments, at least a portion of a device may be formed within the layer 245 and/or at least a portion of the device may be formed over the front side of semiconductor layer 230. In one or more embodiments, at least a portion of the device may be formed within the semiconductor layer 230. In one or more embodiments, at least a portion of the device may be formed over the front side of semiconductor layer 230. In one or more embodiments, a portion of the device may be formed within the layer 230 and a portion of the device may be formed over the front side of layer 230.

Examples of the device 245 have been provided above. In some embodiments, the device 245 may be a lateral device. In some embodiments, a lateral device may be a device where the device current flows substantially perpendicular to the thickness of the semiconductor layer 230. The device current may, for example, be the channel current of a transistor (such as a MOS transistor). An example of a lateral device is a lateral DMOS transistor. Another example of a lateral device is an Insulated Gate Bipolar Transistor (IGBT).

An example of a lateral device is shown as device 245 in FIG. 14B. The illustrative device 245 shown in FIG. 14B provides an example of an IGBT. The device shown in FIG. 14B includes an n+ doped region 310 formed in the semiconductor layer 230 (for example, a monocrystalline silicon layer), a source region 410 overlying the n+ doped region 310, a p well 320 formed in the semiconductor layer 230, a gate stack 420 overlying the p well 320 (where the gate stack 420 includes a gate electrode 424 overlying a gate dielectric layer 422). The device further includes an n-drift region 330 formed in the semiconductor layer 230, an n doped region 340 formed in the semiconductor layer 230, a p+ region 350 formed in the semiconductor layer 230, and a drain region 430 overlying the p+ region 350.

In one or more embodiments, the device 245 shown in FIG. 14B may be replaced another device. In some embodiments, the device 245 shown in either FIG. 14A or FIG. 14B may be coupled together with other devices either on the same chip or on another chip to form an integrated circuit. In one or more embodiments, it may be possible that the silicone rubber layer 260 may help to reduce the amount of mobile charges below the device 245.

Figure 15:
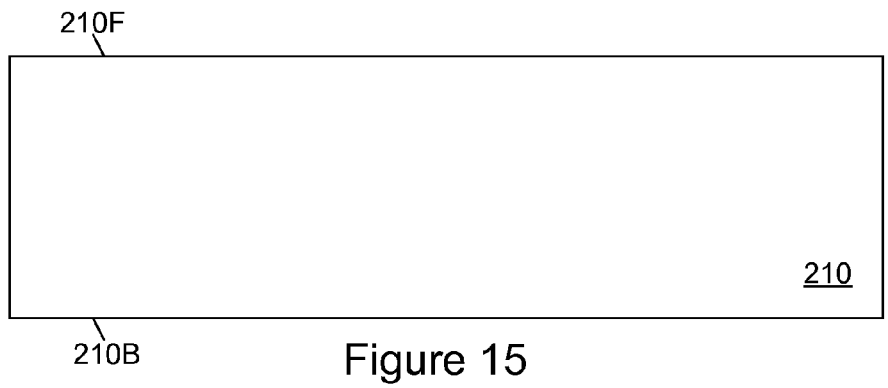
FIGS. 15 through 26 show a process for making a semiconductor structure in accordance with an embodiment of the present invention.

FIGS. 15 through 26 show another method of manufacturing a semiconductor structure in accordance with an embodiment of the present invention. FIG. 15 shows a support structure 210. The support structure has a front side 210F and a back side 210B. As described above, the support structure 210 may be any type of support structure such as, for example, a semiconductor substrate. The semiconductor substrate may be a bulk semiconductor substrate (such as a bulk semiconductor wafer). In one or more embodiments the bulk semiconductor substrate may be a bulk silicon substrate (such as a bulk silicon wafer).

Figure 16:
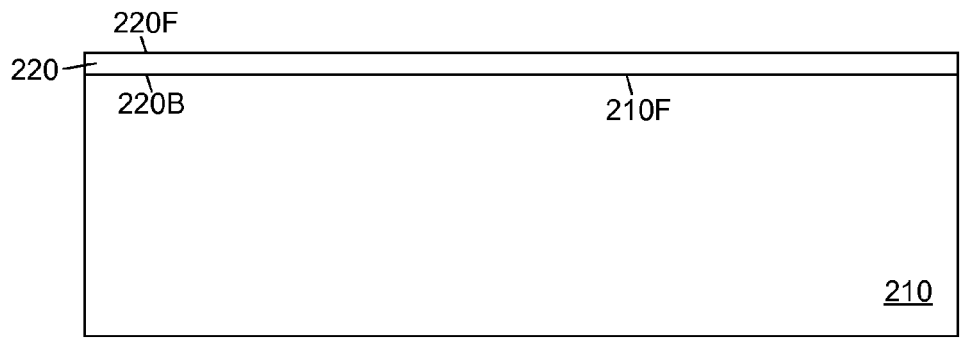

Referring to FIG. 16, an etch stop layer 220 may be formed over the front side 210F of bulk semiconductor substrate 210. The etch stop layer 220 may be grown or may be deposited. In one or more embodiments, the etch stop layer 220 may be formed in direct contact with the substrate 210. The etch stop layer 220 includes a front side 220F and a back side 220B. In one or more embodiments, the etch stop layer 220 may be a dielectric layer. In one or more embodiments, the etch stop layer 220 may, for example, comprise a dielectric material such as an oxide, nitride and/or oxynitride. In one or more embodiments, the etch stop layer 220 may comprise an oxide. The oxide may be a silicon dioxide. In one or more embodiments, the oxide may be a grown oxide. The grown oxide may, for example, be formed using a thermal growth process. Hence, in one or more embodiments, the oxide may be a grown silicon dioxide. In one or more embodiments, the oxide may be a deposited oxide. For example, the oxide may be a deposited silicon dioxide.

Hence, in the embodiment of FIG. 2, it is seen that an etch stop layer 220 may be formed within the substrate 210 while in the embodiment of FIG. 16 it is seen that an etch stop layer 220 may be formed over the front side 210F of substrate 210. It is understood that the etch stop layer 220 shown in FIG. 2 (which may be formed within the substrate 210) and the etch stop layer 220 shown in FIG. 16 (which may be formed over the substrate 210) may comprise different materials. The etch stop layer 220 has a front side 220F and a back side 220B.

Figure 17:
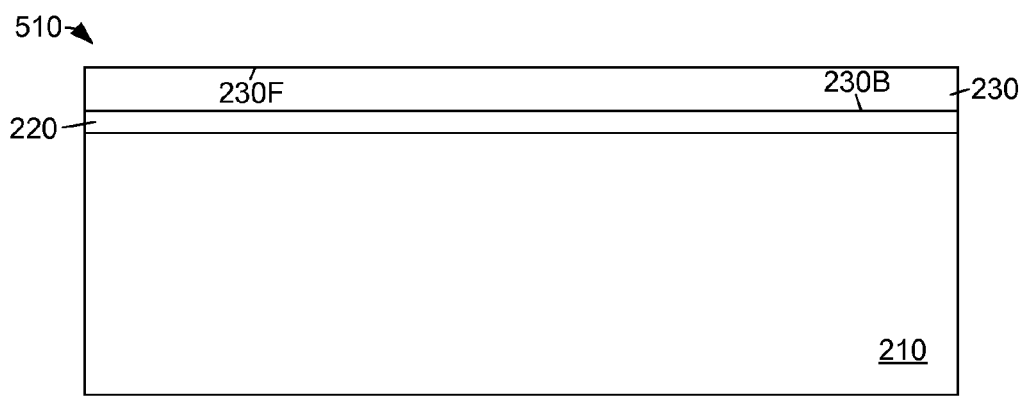

FIG. 17 shows a structure 510. Referring to FIG. 17, a semiconductor layer 230 may be formed over the front side 220F of the etch stop layer 220. In one or more embodiments, the semiconductor layer 230 may be formed in direct contact with the etch stop layer 220. The semiconductor layer 230 has a front side 230F and a back side 230B. The semiconductor layer 230 may comprise one or more semiconductor materials. The semiconductor layer 230 may, for example, comprise monocrystalline silicon. The semiconductor layer 230 may be a silicon layer. The silicon layer may, for example, be a bulk monocrystalline silicon layer. The silicon layer may be p-doped or n-doped. The dopants may be introduced in-situ or they may be introduced after the layer 230 is formed by, for example, ion implantation or diffusion.

In one or more embodiments, the semiconductor layer 230 may be formed using certain techniques related to SOI semiconductor substrate (e.g. SOI semiconductor wafer) manufacturing. In one or more embodiments, the semiconductor layer 230 may be formed using a bonding (e.g. wafer bonding) method. In one or more embodiments, it may be possible that the semiconductor layer 230 be formed using a seed method.

It is noted that the semiconductor layer 230 may include any semiconductor material and is not limited to silicon. The semiconductor layer may include one or more semiconductor materials. The semiconductor layer may include one or more semiconductor compounds. Examples of semiconductor materials include silicon, GaAs, GaN and combinations thereof. In one or more embodiments, the semiconductor layer 230 may be formed of the same semiconductor materials as the semiconductor substrate 210. In one or more embodiments, the semiconductor layer 230 may comprise one or more different semiconductor materials from the semiconductor substrate 210.

Figure 18A:
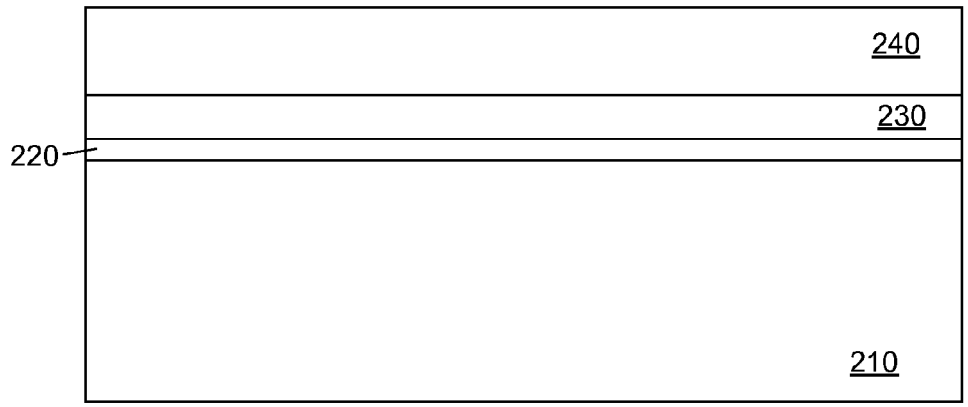

Referring to FIG. 18A, in one or more embodiments, a layer 240 may be formed over the front side 230F of semiconductor layer 230. As noted above, the layer 240 may represent the formation of one or more metallization levels and inter-level dielectric layers. Likewise, the layer 240 may represent one or more CMOS process steps. In one or more embodiments, it is also possible that the layer 240 may not be formed.

Figure 18B:
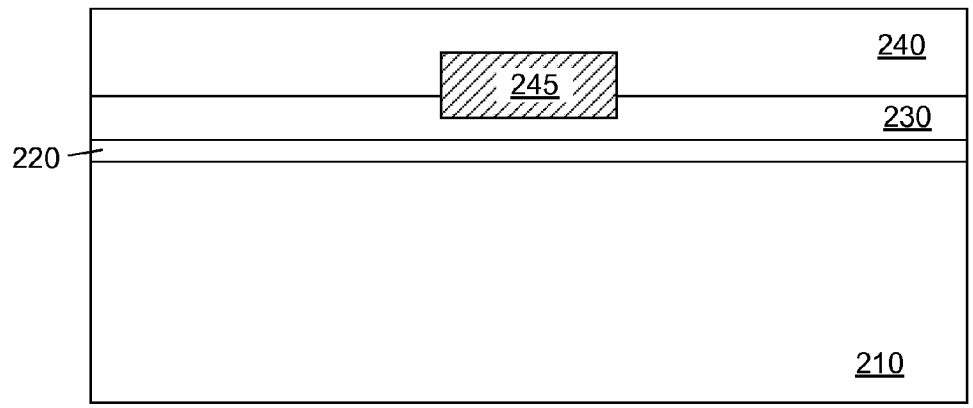

As noted above, a device 245 may be formed over the front side of semiconductor substrate 210. The device 245 may be formed at least partially within layer 230 and/or at least partially over the front side of layer 230. FIG. 18B shows an example of a device 245 formed over the front side of substrate 210. Examples of the device 245 have been discussed above and the same discussion is applicable here.

Figure 19:
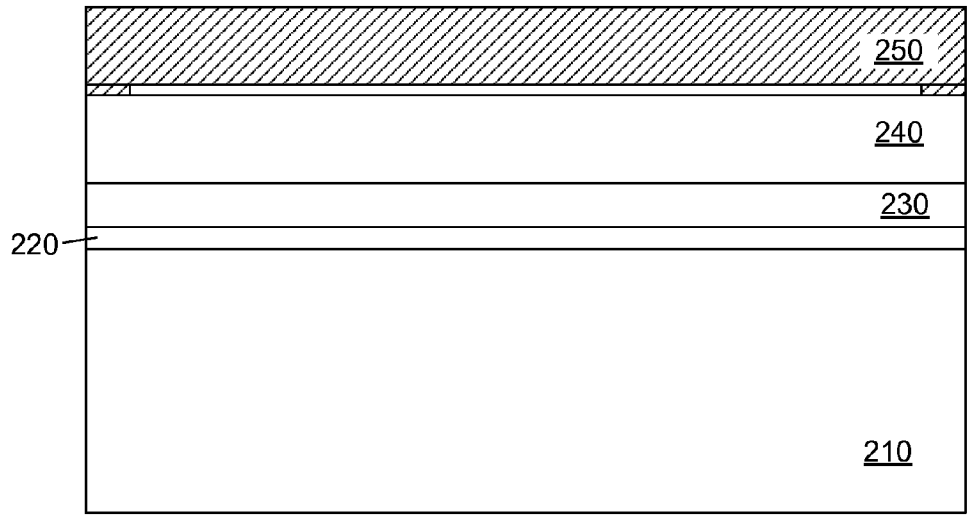

Referring to FIG. 19, a protection structure 250 (e.g. a protection wafer) may be attached to the structure shown in FIG. 18A or FIG. 18B.

Figure 20:
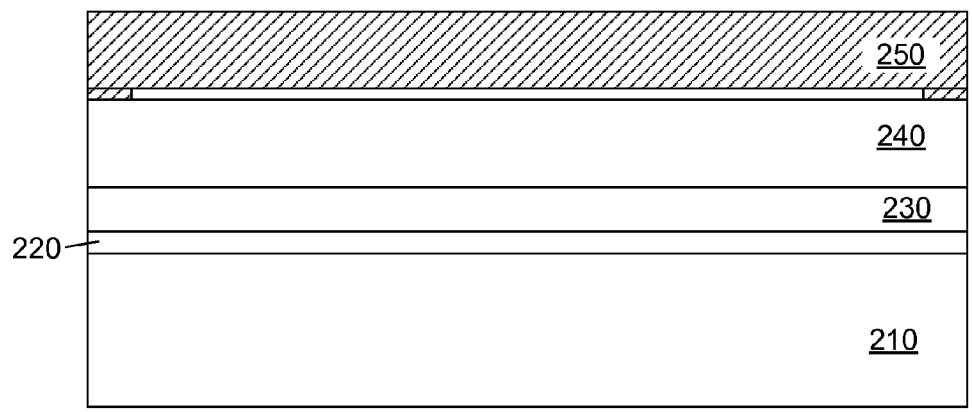

Referring to FIG. 20, a portion of the bulk semiconductor substrate 210 may be removed by a back side grinding process. As noted, the bulk semiconductor substrate 210 may be a bulk silicon substrate (such as a bulk silicon wafer).

Figure 21:
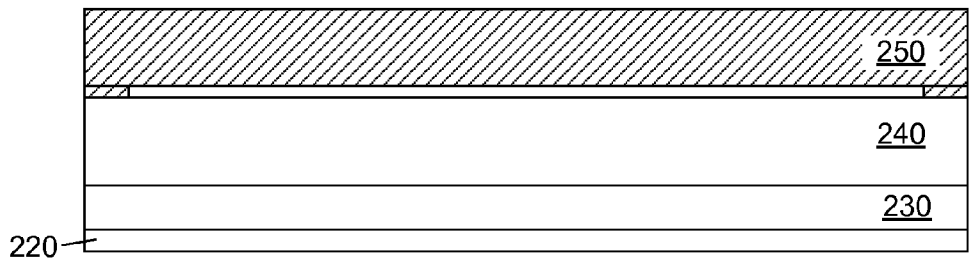

Referring to FIG. 21, an etching process may be performed to etch the back side of the substrate 210 and remove the remainder of the semiconductor substrate 230 up to the etch stop layer 210. The etching process may be a wet etching process which may stop essentially on the etch stop layer 220. An appropriate etchant may include phosphoric acid. An appropriate etchant may be one which removes the semiconductor substrate 210 (which may, for example, be monocrystalline silicon) selective to the etch stop layer 220 (which may, for example, be an oxide). As noted above, in some instances, it may be possible that a trace amount of the substrate 210 (or some other support structure) may remain.

Figure 22:
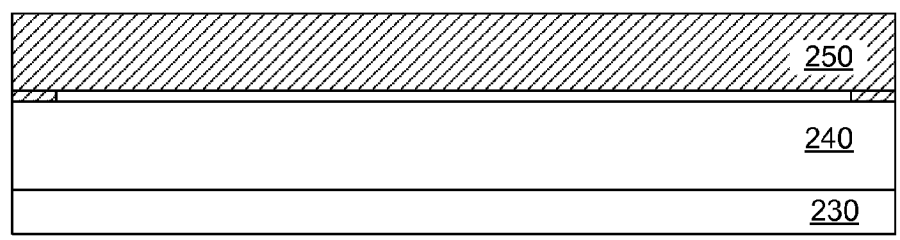

Referring to FIG. 22, the etch stop layer 220 may then be removed. The removal process may include an etching process such as a wet etching process. The etchant used to remove the etch stop layer 220 may, for example, be a hydrogen fluoride (e.g. HF) etchant. The etch used to remove the etch stop layer 220 may stop essentially on the semiconductor layer 230. It is understood that some small amount of the semiconductor conductor layer 230 may be also be removed in the process. In one or more embodiments, the etchant used to remove the etch stop layer 220 may be one which removes the etch stop layer 220 selective to the semiconductor layer 230.

Figure 23:
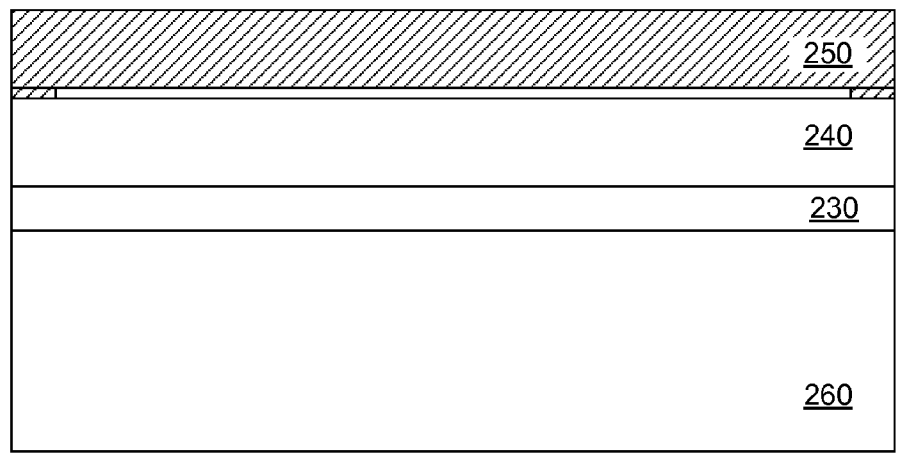

Referring to FIG. 23, a dielectric layer 260 may be formed over the back side of the semiconductor layer 230. In one or more embodiments, the dielectric layer 260 may comprise (or may consist essentially of silicone rubber). In one or more embodiments, the dielectric layer 260 may be a silicone rubber layer. Other examples of dielectric layer 260 have been provided herein.

Figure 24:
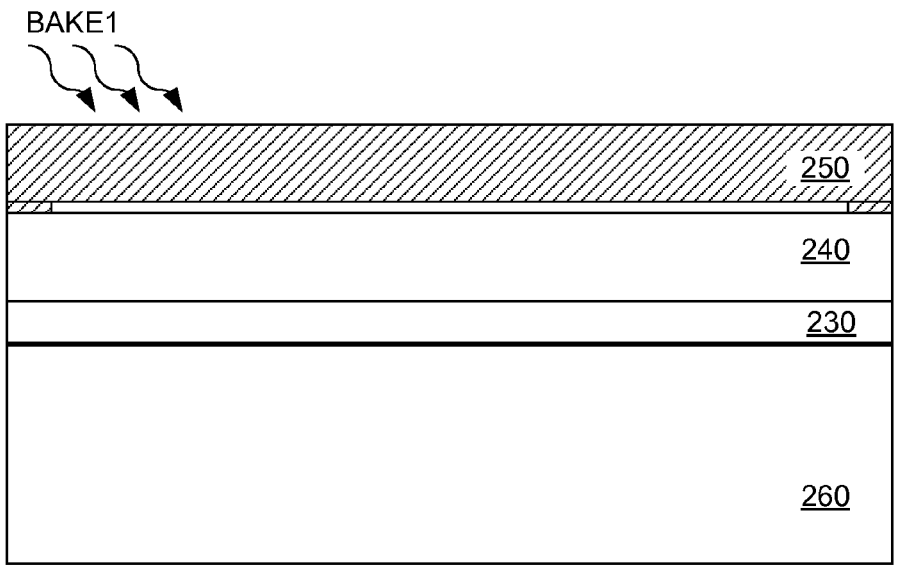
Figure 25:
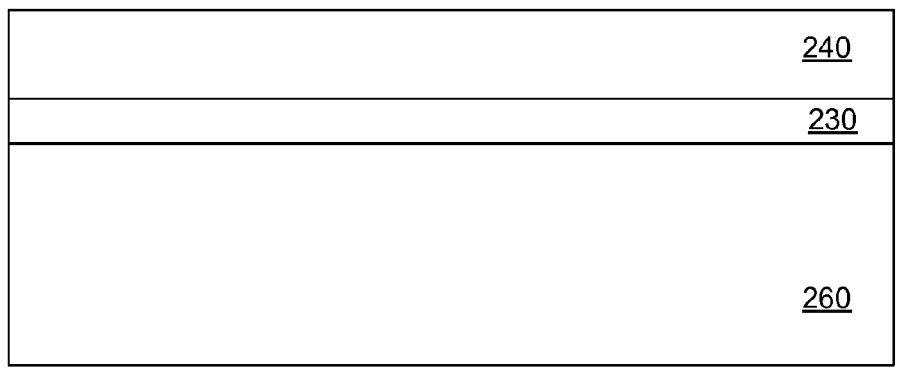
Figure 26:
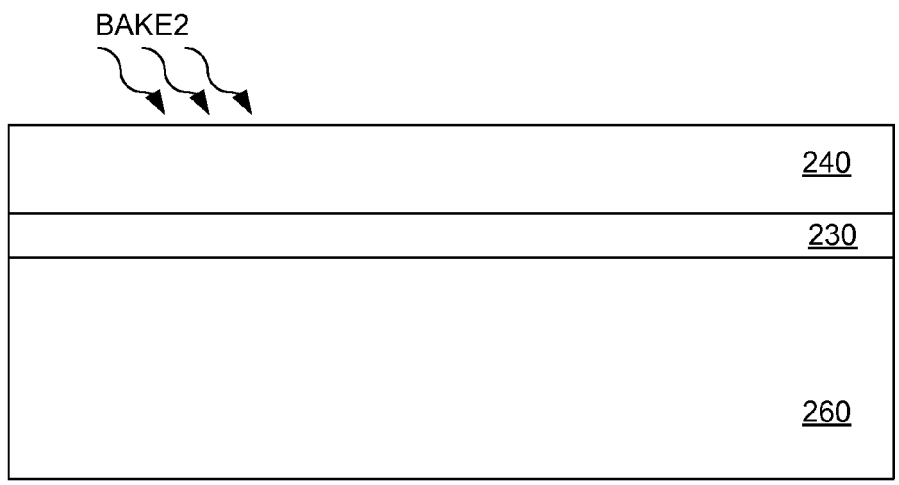
Figure 27:
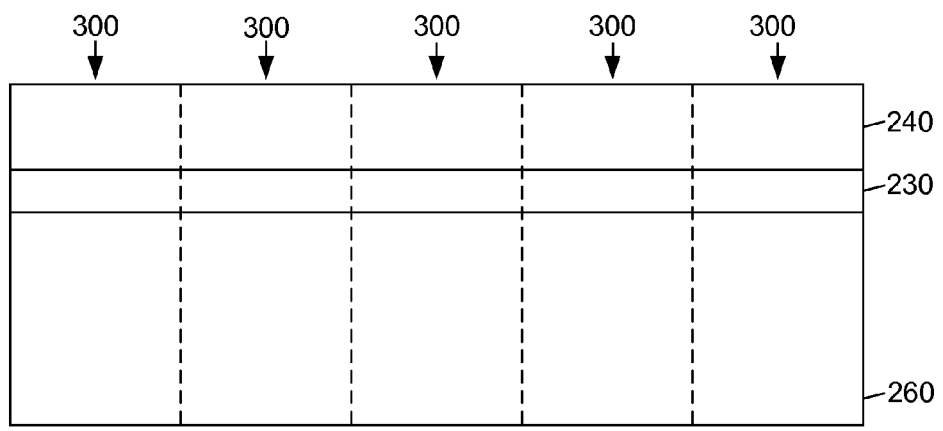
FIG. 27 shows dicing of the structure from FIG. 26.
Figure 28:
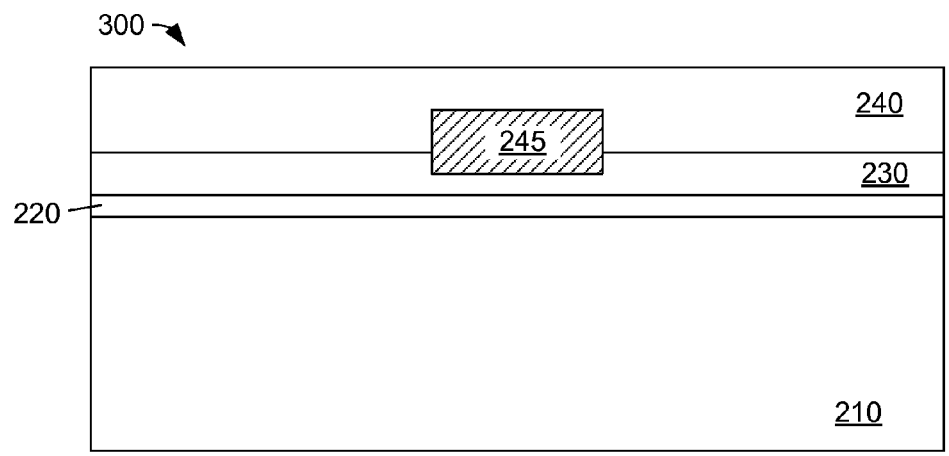
FIG. 28 shows a semiconductor structure including a device in accordance with the present invention.

FIG. 24 shows that a first bake process BAKE1 may be performed. The conditions for the first bake process BAKE1 have been described above and may be the same here. FIG. 25 shows that the protection structure 250 may then be removed. FIG. 26 shows that a second bake process BAKE2 may be performed. The conditions for the second bake process BAKE2 have been described above and may be the same here. FIG. 27 shows that the structure from FIG. 26 may be diced (e.g. separated or partitioned) into individual structures 300 where each structure 300 may represent a semiconductor chip and/or integrated circuit. FIG. 28 provides an example of a structure 300 which may be a semiconductor chip and/or integrated circuit. The structure 300 may include a device 245.

In one or more embodiments, it may also possible that the protection structure 250 be removed at any time after the back side grinding of the semiconductor substrate 210. It may also be possible that a protection structure 250 is not used.

Referring again to FIG. 17, it is seen that a structure 510 may be formed. In one or more embodiments, the structure 510 of FIG. 17 may include a bulk semiconductor substrate 210, an etch stop layer 220 overlying the substrate 210 and a semiconductor layer 230 overlying the etch stop layer 220. As noted above, in some embodiments, etch stop layer 220 may be a dielectric layer such as an oxide layer (e.g. a silicon dioxide layer).

Figure 29:
FIG. 29 shows an embodiment of an SOI substrate.

In some embodiments, the structure 510 may, in some embodiments, be replaced with an SOI semiconductor substrate (e.g. an SOI semiconductor wafer). The SOI substrate (e.g. SOI wafer) may be made or purchased. FIG. 29 shows a structure 1510 which is an example of an SOI semiconductor substrate (e.g. an SOI wafer). The SOI substrate 1510 in FIG. 29 may include a bulk semiconductor substrate 1210, an SOI dielectric layer 1220 overlying the bulk substrate 1210 and a semiconductor layer 1230 overlying the SOI dielectric layer 1220. In one or more embodiments, the SOI dielectric layer 1220 may be a buried oxide layer. In one or more embodiments, the SOI semiconductor substrate 1510 may be a silicon-on-insulator substrate (e.g. silicon-on-insulator wafer). In one or more embodiments, a silicon-on-insulator substrate may include a bulk silicon substrate (e.g. monocrystalline silicon), and SOI dielectric layer overlying the bulk silicon substrate and a silicon layer (e.g. monocrystalline silicon) overlying the SOI dielectric layer. As noted, in one or more embodiments, the SOI dielectric layer may be a buried oxide layer.

In comparing the structure 510 shown in FIG. 17 with the SOI substrate 1510 shown in FIG. 29, it is seen that the bulk semiconductor substrate 1210 of the SOI semiconductor substrate (e.g. SOI semiconductor wafer) may take the place of the bulk semiconductor substrate 210. Likewise, the SOI dielectric layer 1220 of the SOI substrate 1510 may take the place of the etch stop layer 220. Likewise, the semiconductor layer 1230 of the SOI substrate 1510 may serve as the semiconductor layer 230 of the structure 510.

As least a portion of the processing steps as depicted in FIGS. 18A,B through 27 may be formed on the SOI substrate (e.g. SOI wafer) 1510 shown in FIG. 29. For example, the bulk substrate 1210 may be removed. The SOI dielectric layer 1220 may then also be removed. A second dielectric layer (for example, a silicone rubber layer) may be formed over the back side of the semiconductor layer 1230. In one or more embodiments, it may also be possible that the SOI dielectric layer 1220 is not removed. In this case, a second dielectric layer (for example, a silicone rubber layer) may be formed over the back side (e.g. bottom side) of the SOI dielectric layer 1220.

In the embodiments shown in FIG. 1 and in FIG. 15, the support structure 210 may be a bulk semiconductor substrate (e.g. a bulk semiconductor wafer). In one or more embodiments, the bulk semiconductor substrate may be a bulk silicon substrate (e.g. a bulk silicon wafer).

However, in other embodiments, the bulk semiconductor substrate may be replaced with any other type of support structure. Hence, the support structure 210 may be any type of support structure. In one or more embodiments, the support structure may be any type of semiconductor substrate (e.g. a semiconductor wafer). In one or more embodiments, the semiconductor substrate may be a bulk semiconductor substrate (e.g. a bulk semiconductor wafer). In one or more embodiments, the semiconductor substrate may be an SOI semiconductor substrate (e.g. an SOI semiconductor wafer). In one or more embodiments, a semiconductor substrate may be a silicon substrate (e.g. a silicon wafer) such as a bulk silicon substrate (e.g. bulk silicon wafer) or an SOI silicon substrate (e.g. SOI silicon wafer).

In some embodiments, the support structure 210 (as shown, for example, in FIG. 1 and in FIG. 15) may comprise a material other than a semiconductor material. The support structure may comprise, for example, a dielectric material and/or a conductive material. The support structure 210 may comprise, for example, a plastic material, a rubber material, a glass material and/or a ceramic material. In some embodiments, the support structure 210 may comprise a material having substantially the same thermal expansion coefficient as the semiconductor layer 230.

In some embodiments, the support structure 210 may be a homogeneous layer. In some embodiments, the support structure may include a stack of a plurality of sub-layers of different materials. Hence, as noted, the support structure 210 shown in FIG. 1 and in FIG. 15 may itself be an SOI semiconductor substrate (e.g. SOI semiconductor wafer) or some other structure (for example, a composite structure).

A semiconductor layer 230 may be formed over the support structure 210 and the support structure 210 may then removed and replaced with a silicone rubber layer (or some other dielectric layer). Hence, the support structure 210 may be removed (possibly by mechanical and or chemical means) and replaced by the silicone rubber layer (or some other dielectric layer). In one or more embodiments, one or more electronic devices (or an integrated circuit) may be formed within and/or over front side of the semiconductor layer 230 prior to removal of the support structure 210. In one or more embodiments, it may be possible to form one or more electronic devices (or an integrated circuit) after the support structure 210 has been replaced with a silicone rubber layer (or other dielectric layer). In one or more embodiments, it may be possible to form one or more electronic devices (or an integrated circuit) after the support structure 210 has been removed but before it has been replaced with a silicone rubber layer (or other dielectric layer). In some embodiments, one or more etch stop layers may be formed within the support structure 210. In some embodiments, one or more etch stop layers may be formed over the support structure 210. In some embodiments, it may be possible that one or more etch stop layers be formed within the support structure and one or more etch stop layers be formed over the support structure.

In one or more embodiments, it is possible that the silicone rubber layer be replaced with a layer of a different material. In one or more embodiments, the different material may be a dielectric material. In one or more embodiments, the different material may remain stable (e.g. thermally and/or chemically stable) at a temperature of about 250° C.

One or more embodiments relate to a method for forming a semiconductor structure, comprising: providing a support structure; forming a semiconductor layer over the support structure; removing the support structure; and forming a dielectric layer over a back side of the semiconductor layer after removing the support structure. In one or more embodiments, the dielectric layer may be a silicone rubber layer.

One or more embodiments relate to a method for forming a semiconductor structure, comprising: providing a semiconductor substrate; forming a semiconductor layer over the semiconductor substrate; forming a device within the semiconductor layer and/or over a front side of the semiconductor layer; removing the semiconductor substrate; and forming a dielectric layer over a back side of the semiconductor layer after removing the bulk semiconductor substrate. In one or more embodiments, the dielectric layer may be a silicone rubber layer. In one or more embodiments, said semiconductor substrate may be a semiconductor wafer.

One or more embodiments relate to a method for forming a semiconductor structure, comprising: providing an SOI semiconductor substrate, the SOI substrate including a bulk semiconductor substrate, a first dielectric layer overlying the bulk substrate and a semiconductor layer overlying the first dielectric layer; removing the bulk substrate; and forming a second dielectric layer over a back side of the semiconductor layer after removing the bulk substrate. In one or more embodiments, the second dielectric layer may be a silicone rubber layer.

One or more embodiments relate to a method for forming a semiconductor structure, comprising: forming a semiconductor layer; and forming a dielectric layer over a back side of the semiconductor layer.

One or more embodiments relate to a semiconductor structure, comprising: a silicone rubber layer; and a semiconductor layer overlying the silicone layer.

One or more embodiments relate to a semiconductor structure, comprising: a dielectric layer having a thickness of at least about 25 microns; and a semiconductor layer overlying the dielectric layer.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

What is claimed is:

1. A method for forming a semiconductor structure, comprising:
   providing a support structure;
   forming a semiconductor layer over said support structure;
   removing said support structure;
   forming a dielectric layer over a back side of said semiconductor layer after removing said support structure; and
   forming a first bake process after forming said dielectric layer.

2. The method of claim 1, forming a device before removing said support structure, at least a portion of said device formed within said semiconductor layer and/or at least a portion of said device formed over a front side of said semiconductor layer.

3. The method of claim 1, further comprising performing a second bake process after said first bake process.

4. The method of claim 1, wherein said forming said semiconductor layer comprises an epitaxial growth process.

5. The method of claim 1, further comprising forming an etch stop layer within said support structure before forming said semiconductor layer.

6. The method of claim 5, wherein removing said support structure includes removing a part of said support structure which is not said etch stop layer and removing said etch stop layer.

7. The method of claim 1, further comprising forming an etch stop layer over said support structure before forming said semiconductor layer.

8. The method of claim 7, further comprising removing said etch stop layer after removing said support structure.

9. The method of claim 1, wherein said dielectric layer comprises silicone rubber.

10. The method of claim 1, wherein said dielectric layer is a silicone rubber layer.

11. The method of claim 1, wherein said dielectric layer has a thickness of at least 25 microns.

12. The method of claim 1, wherein said semiconductor layer is a silicon layer.

13. The method of claim 1, wherein said semiconductor layer comprises monocrystalline silicon.

14. The method of claim 1, wherein said support structure is a semiconductor substrate.

15. The method of claim 14, wherein said semiconductor substrate is a bulk semiconductor substrate.

16. The method of claim 15, wherein said bulk semiconductor substrate is a bulk silicon substrate.

17. The method of claim 16, wherein said bulk silicon substrate is a bulk silicon wafer.

18. The method of claim 14, wherein said semiconductor substrate is an SOI semiconductor substrate.

19. The method of claim 14, wherein said semiconductor substrate is a semiconductor wafer.

20. A method for forming a semiconductor structure, comprising:
    providing an SOI semiconductor substrate, said SOI substrate including a bulk semiconductor substrate, a first dielectric layer overlying said bulk substrate and a semiconductor layer overlying said first dielectric layer;
    removing said bulk substrate;
    removing said first dielectric layer; and
    forming a second dielectric layer over a back side of said semiconductor layer after removing said bulk substrate and after removing said first dielectric layer.

21. The method of claim 20, wherein said second dielectric layer is formed over the backside of said first dielectric layer.

22. The method of claim 20, further comprising forming a device before removing said bulk substrate, at least a portion of said device formed within said semiconductor layer and/or at least a portion of said device formed over a front side of said semiconductor layer.

23. The method of claim 20, wherein said second dielectric layer has a thickness of at least about 25 microns.

24. The method of claim 20, wherein said second dielectric layer comprises silicone rubber.

25. The method of claim 20, wherein said second dielectric layer is a silicone rubber layer.

26. The method of claim 20, wherein said SOI semiconductor substrate is an SOI semiconductor wafer.

27. A method for forming a semiconductor structure, comprising:
    forming a semiconductor layer;
    forming a dielectric layer over a back side of said semiconductor layer; and
    performing a first bake process after forming said dielectric layer.

28. The method of claim 27, forming a device before forming said dielectric layer, at least a portion of said device formed within said semiconductor layer and/or at least a portion of said device formed over a front side of said semiconductor layer.

29. The method of claim 27, further comprising performing a second bake process after said first bake process.

30. The method of claim 27, wherein said forming said semiconductor layer comprises an epitaxial growth process.

31. The method of claim 27, wherein said dielectric layer comprises silicone rubber.

32. The method of claim 27, wherein said dielectric layer is a silicone rubber layer.

33. The method of claim 27, wherein said dielectric layer has a thickness of at least 25 microns.

34. The method of claim 27, wherein said semiconductor layer is a silicon layer.

35. The method of claim 27, wherein said semiconductor layer comprises monocrystalline silicon.

* * * * *